(12) United States Patent
Ogata et al.

(10) Patent No.: US 11,716,814 B2
(45) Date of Patent: *Aug. 1, 2023

(54) TECHNOLOGIES FOR MOUNTING DISPLAY DRIVER INTEGRATED CIRCUIT CHIPS ON DISPLAY PANELS

(71) Applicant: Synaptics Incorporated, San Jose, CA (US)

(72) Inventors: Toshifumi Ogata, Tokyo (JP); Atsushi Maruyama, Tokyo (JP); Goro Sakamaki, Tokyo (JP)

(73) Assignee: Synaptics Incorporated, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/853,854

(22) Filed: Jun. 29, 2022

(65) Prior Publication Data

US 2022/0338353 A1 Oct. 20, 2022

Related U.S. Application Data

(63) Continuation of application No. 17/180,577, filed on Feb. 19, 2021, now Pat. No. 11,425,820.

(51) Int. Cl.
*H05K 1/18* (2006.01)
*G06F 1/18* (2006.01)
*H05K 3/30* (2006.01)

(52) U.S. Cl.
CPC ............. *H05K 1/181* (2013.01); *G06F 1/183* (2013.01); *H05K 3/303* (2013.01); *H05K 2201/10128* (2013.01); *H05K 2201/10212* (2013.01); *H05K 2203/166* (2013.01)

(58) Field of Classification Search
CPC .................. H05K 1/181; H05K 3/303; H05K 2201/10128; H05K 2203/166
See application file for complete search history.

(56) References Cited

U.S. PATENT DOCUMENTS

| | | | |
|---|---|---|---|
| 2011/0100687 A1* | 5/2011 | Hong | H01L 24/50 174/262 |
| 2014/0029230 A1 | 1/2014 | Oh | |
| 2018/0157362 A1 | 6/2018 | Kim | |
| 2019/0371260 A1 | 12/2019 | Kim | |
| 2019/0371691 A1* | 12/2019 | Han | G02F 1/13452 |
| 2020/0401361 A1 | 12/2020 | Han | |

* cited by examiner

*Primary Examiner* — Sherman Ng
(74) *Attorney, Agent, or Firm* — Ferguson Braswell Fraser Kubasta PC

(57) ABSTRACT

A display panel includes a plastic substrate and a first inner lead bonding (ILB) electrode on the plastic substrate. The first ILB electrode includes a first bonding segment, a second bonding segment, and a first connection segment. The first bonding segment is extended in a first direction oblique to a vertical direction of the display panel. The first connection segment is configured to provide an electrical connection between the first bonding segment and the second bonding segment. The first ILB electrode is configured to be bonded to an integrated circuit chip using one of the first bonding segment or the second bonding segment.

18 Claims, 20 Drawing Sheets

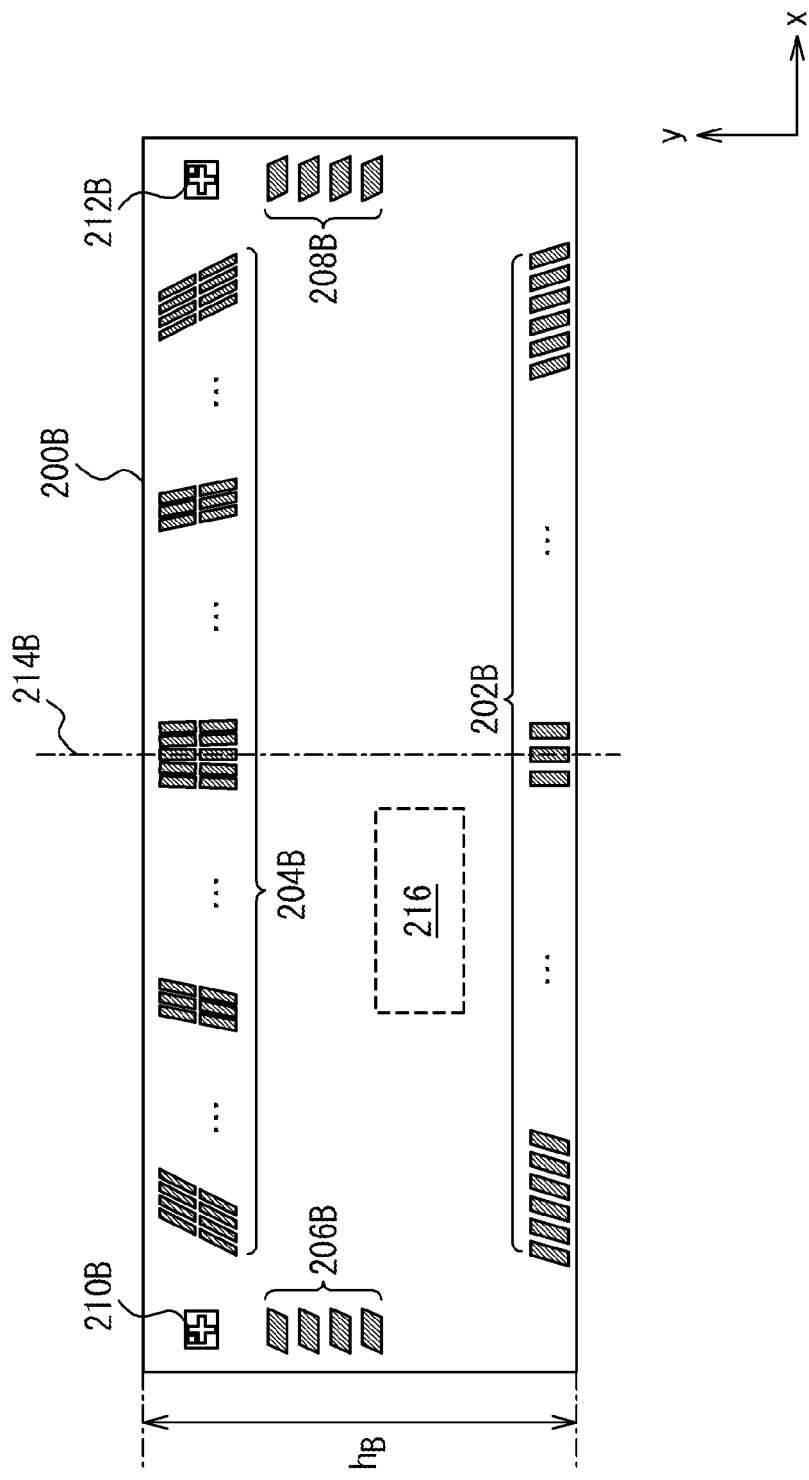

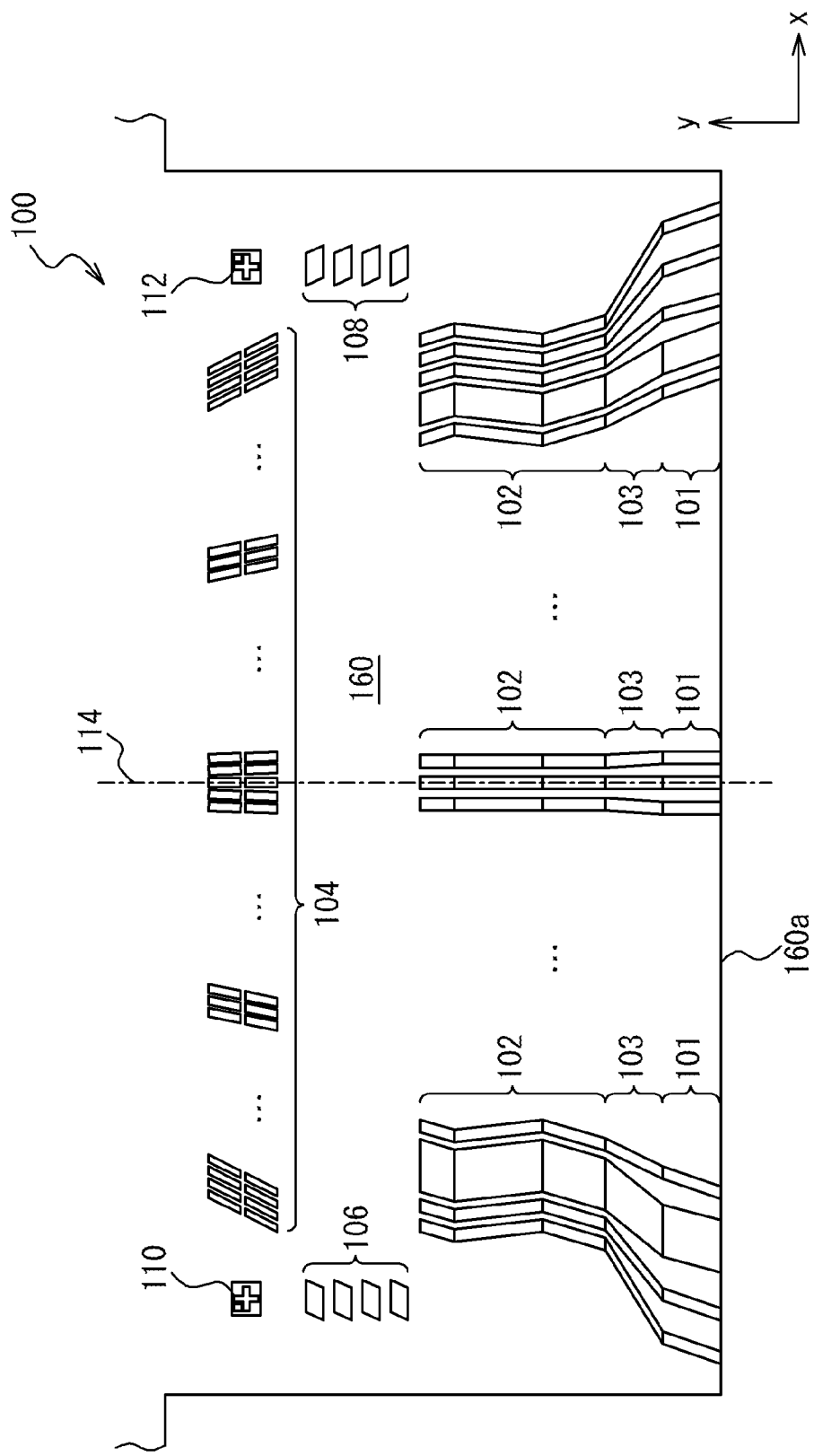

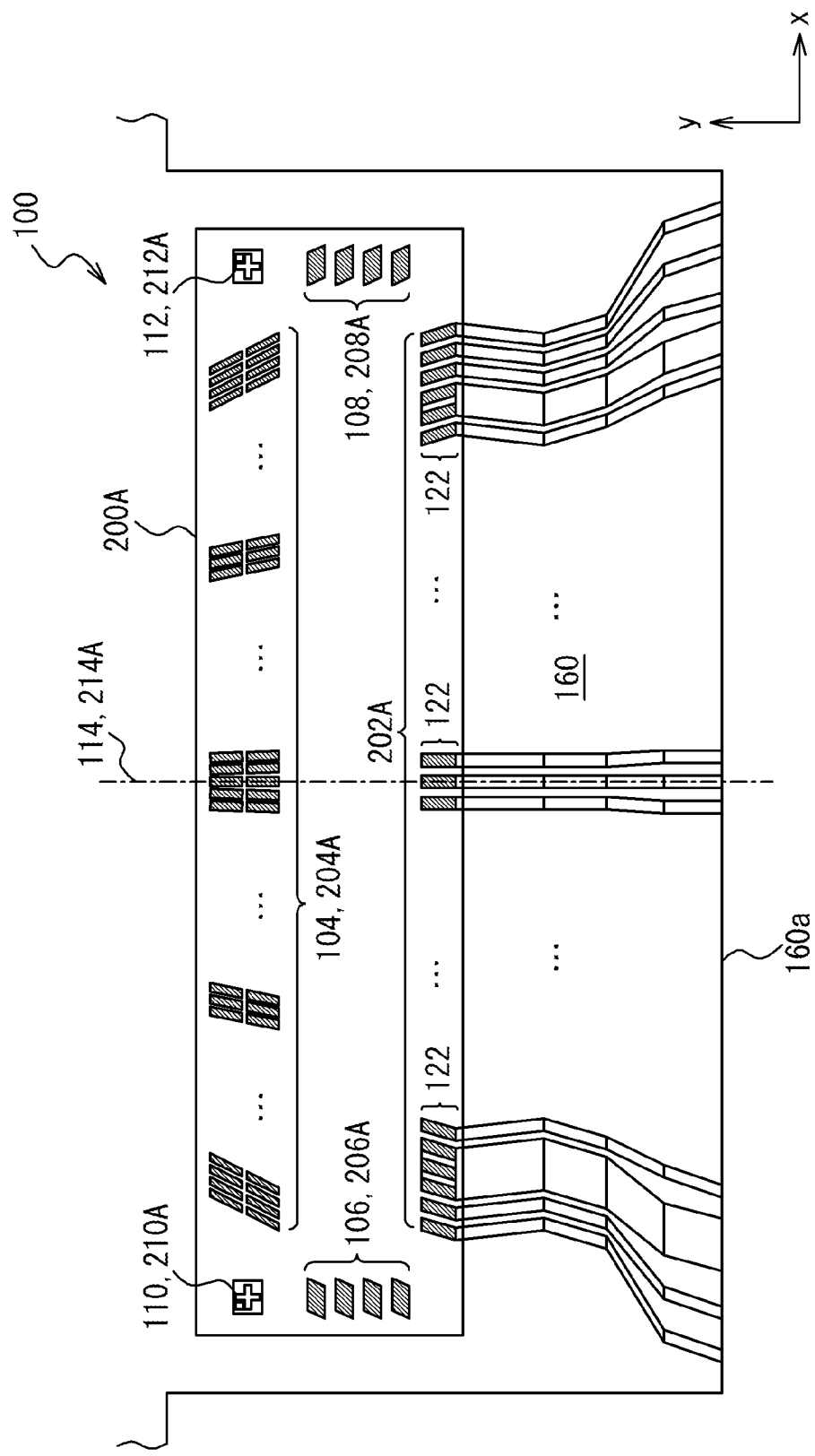

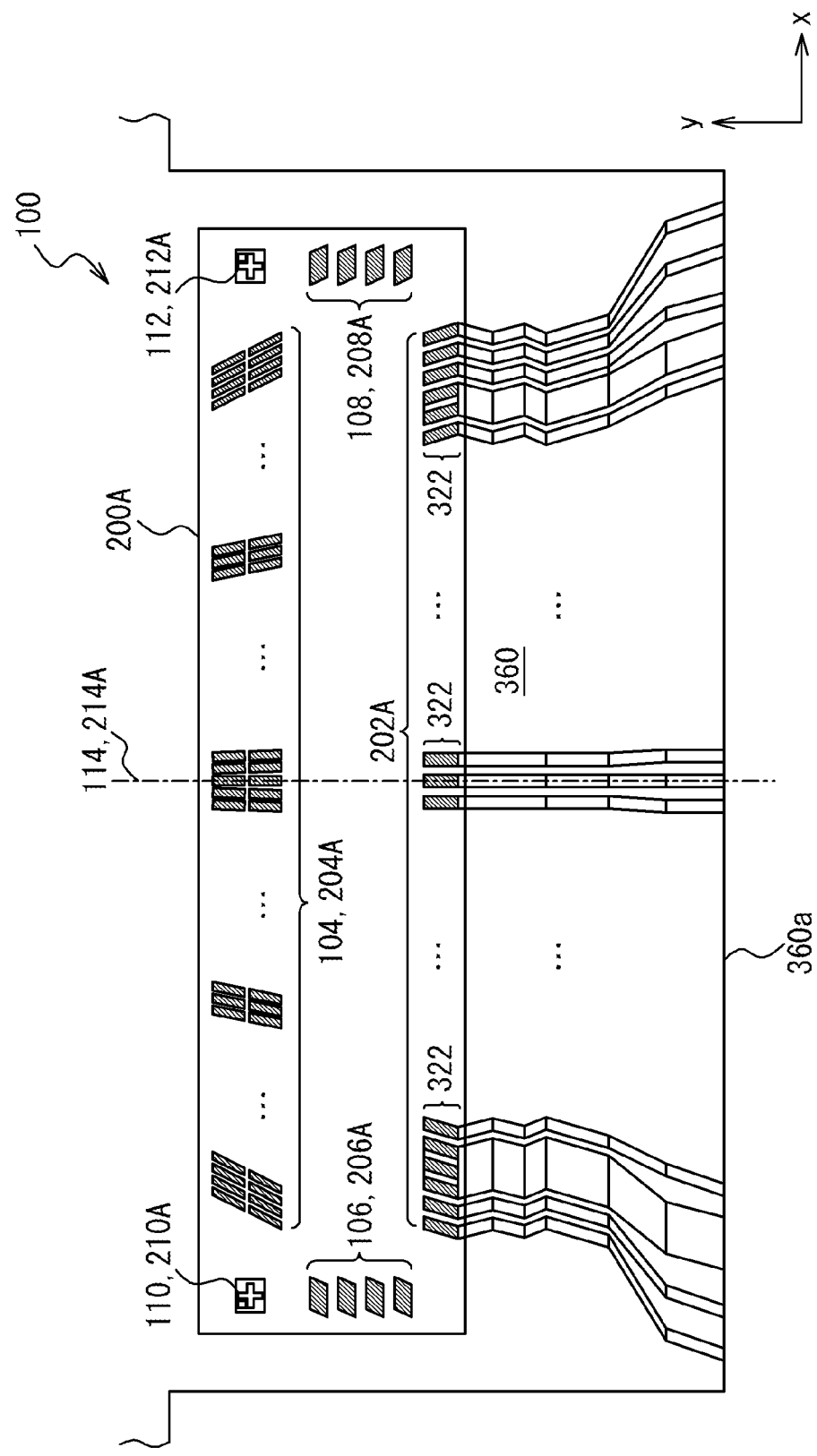

TECHNOLOGIES FOR MOUNTING DISPLAY DRIVER INTEGRATED CIRCUIT CHIPS ON DISPLAY PANELS

CROSS REFERENCE TO RELATED APPLICATIONS

This application is a continuation of, and thereby claims benefit under 35 U.S.C. § 120 to, U.S. patent application Ser. No. 17/180,577 filed on Feb. 19, 2021. U.S. patent application Ser. No. 17/180,577 is incorporated herein by reference in its entirety.

FIELD

The disclosed technology generally relates to technologies for mounting display driver integrated circuit (DDIC) chips on display panels.

BACKGROUND

A display module may include a display panel and a DDIC chip mounted on the display panel. In typical implementations, electrodes are disposed on the display panel, and bumps of the DDIC chip are bonded to the electrodes to achieve electrical connections between the display panel and the DDIC chip. The electrodes disposed on the display panel are designed to match the layout of the bumps of the DDIC chip.

SUMMARY

This summary is provided to introduce in a simplified form a selection of concepts that are further described below in the detailed description. This summary is not intended to identify key features or essential features of the claimed subject matter, nor is it intended to limit the scope of the claimed subject matter.

In one or more embodiments, a display panel is provided. The display panel includes a plastic substrate and a first inner lead bonding (ILB) electrode on the plastic substrate. The first ILB electrode includes a first bonding segment, a second bonding segment, and a first connection segment. The first bonding segment is extended in a first direction oblique to a vertical direction of the display panel. The first connection segment is configured to provide an electrical connection between the first bonding segment and the second bonding segment. The first ILB electrode is configured to be bonded to an integrated circuit chip using one of the first bonding segment or the second bonding segment.

In one or more embodiments, a method for preparing display modules is provided. The method includes preparing a display panel. The display panel includes a plastic substrate and a first ILB electrode on the plastic substrate. The first ILB electrode includes a first bonding segment, a second bonding segment, and a first connection segment. The first bonding segment is extended in a first direction oblique to a vertical direction of the display panel. The first connection segment is configured to provide an electrical connection between the first bonding segment and the second bonding segment. The method further includes bonding a first bump of an integrated circuit chip to one of the first bonding segment or the second bonding segment In one or more embodiments, a display module is provided. The display module includes a display panel and a product integrated circuit chip bonded on the display panel. The display panel includes a plastic substrate and a first ILB electrode on the plastic substrate. The first ILB electrode includes a first bonding segment, a second bonding segment, and a first connection segment. The first bonding segment is extended in a first direction oblique to a vertical direction of the display panel. The first connection segment is configured to provide an electrical connection between the first bonding segment and the second bonding segment. A bump of the product DDIC chip is bonded to a selected one of the first bonding segment and the second bonding segment Other aspects of the embodiments will be apparent from the following description and the appended claims.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 2A and FIG. 2B are plan views illustrating example configurations of display driver integrated circuit (DDIC) chips, according to one or more embodiments.

FIG. 3 is a plan view illustrating an example configuration of a driver mounting region of a display panel, according to one or more embodiments.

FIG. 6A and FIG. 6B are plan views illustrating example positioning of DDIC chips on a driver mounting region of a display panel, according to one or more embodiments.

FIG. 14A, FIG. 14B, and FIG. 14C are plan views illustrating example positioning of DDIC chips on a driver mounting region of a display panel, according to one or more embodiments.

Figure 1A:
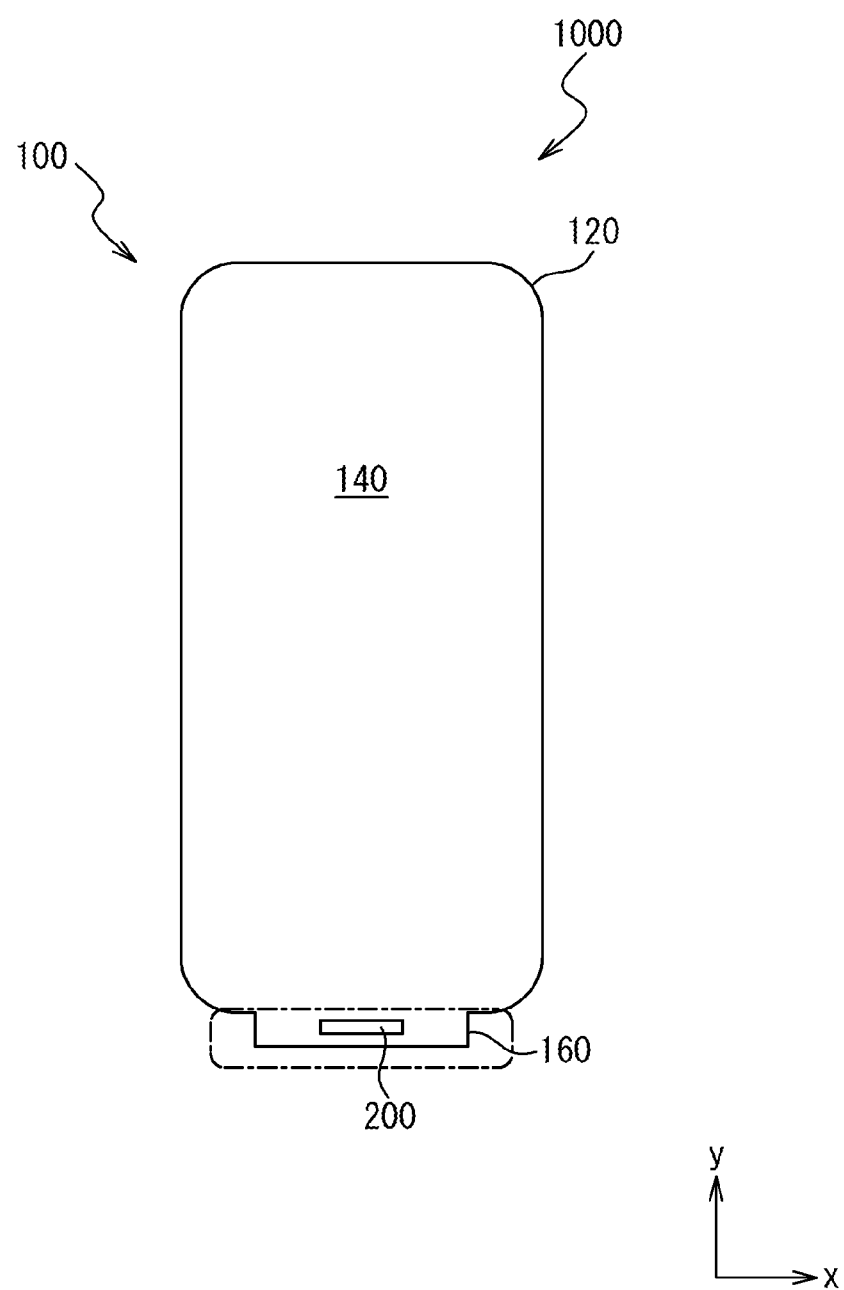
FIG. 1A is a plan view illustrating an example configuration of a display module, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation. Suffixes may be attached to reference numerals for distinguishing identical elements from each other. The drawings referred to herein should not be understood as being drawn to scale unless specifically noted. Also, the drawings are often simplified and details or components omitted for clarity of presentation and explanation. The drawings and discussion serve to explain principles discussed below, where like designations denote like elements.

DETAILED DESCRIPTION

The following detailed description is merely exemplary in nature and is not intended to limit the disclosure or the application and uses of the disclosure. Furthermore, there is no intention to be bound by any expressed or implied theory presented in the preceding background, summary, or the following detailed description.

A display module may include a display panel and a display driver integrated circuit (DDIC) chip configured to drive the display panel. It is noted that the DDIC chip referred herein may be configured to provide one or more other functionalities in addition to the driving of the display panel. For example, the DDIC chip may be configured to process resulting signals received from sensor electrodes disposed in or over the display panel for capacitive proximity sensing.

The DDIC chip may be mounted or bonded on the display panel with a surface mount technology. In one implementation, bumps of the DDIC chip are bonded to corresponding electrodes disposed on the display panel to achieve electrical connections between the DDIC chip and the display panel.

In recent years, flexible or foldable display panels have become popular. One approach to make a display panel flexible is to use a plastic substrate on which display elements (e.g., organic light emitting diodes (OLED) and liquid crystal (LC) cells) are disposed. The surface mount technology for mounting integrated circuits on plastic substrates is often referred to as chip-on-plastic (COP) technology.

One issue may be compatibility between display panels and DDIC chips. To achieve electrical connections between a display panel and a DDIC chip, the display panel is dedicatedly designed to match the layout of the bumps of the DDIC chip. This may make the display panel incompatible to a differently-configured DDIC chip. Conventionally, a display panel is dedicatedly designed for each DDIC chip product, undesirably increasing the cost of the display module.

Another issue may be increased thermal expansion of the plastic substrate during the mounting process. A plastic substrate exhibits a larger thermal expansion than a DDIC chip, which usually includes a silicon substrate, when the plastic substrate is heated during the mounting process. The increased thermal expansion of the plastic substrate may cause larger displacements of the electrodes on the display panel to be bonded to the bumps of the DDIC chip, making it difficult to align the bumps of the DDIC chip with the electrodes on the display panel.

The present disclosure provides various techniques for providing compatibility to multiple DDIC chip products for a display panel including a plastic substrate while mitigating an effect of heat expansion of the plastic substrate. In one or more embodiments, a display panel includes a plastic substrate and a first inner lead bonding (ILB) electrode on the plastic substrate. The first ILB electrode includes a first bonding segment, a second bonding segment, and a first connection segment. The bonding segment referred herein may be a portion of an ILB electrode, the portion being configured to be bonded a bump of a DDIC chip. The first bonding segment is configured to be bonded to a first DDIC chip, and the second bonding segment is configured to be bonded to a second DDIC chip configured differently from the first DDIC chip. The first bonding segment is extended in a first direction oblique to a vertical direction of the display panel. The first connection segment is configured to provide an electrical connection between the first bonding segment and the second bonding segment. The first connection segment may be extended in a second direction different from the first direction. The second bonding segment may be extended in the first direction as with the first bonding segment. The ILB electrode arrangement in which the first and/or second bonding segments extended in the direction oblique to the vertical direction of the display panel may facilitate aligning the bump of the first or second DDIC chip to the ILB electrode in mounting the first or second DDIC chip on the display panel.

FIG. 1A illustrates an example configuration of a display module 1000, according to one or more embodiments. In the illustrated embodiment, the display module 1000 includes a display panel 100 and a DDIC chip 200 bonded on the display panel 100. Examples of the display panel 100 include an OLED display panel, a liquid crystal display (LCD) panel, and other types of display panels. In various embodiments, a plastic substrate 120 is used for the display panel 100 to make the display panel 100 flexible, allowing the display panel 100 to bend. In FIG. 1A and other drawings, the Cartesian coordinate system is introduced to indicate directions, where the x axis is defined in the horizontal direction of the display panel 100 and the y axis is defined in the vertical direction of the display panel 100.

Figure 1B:
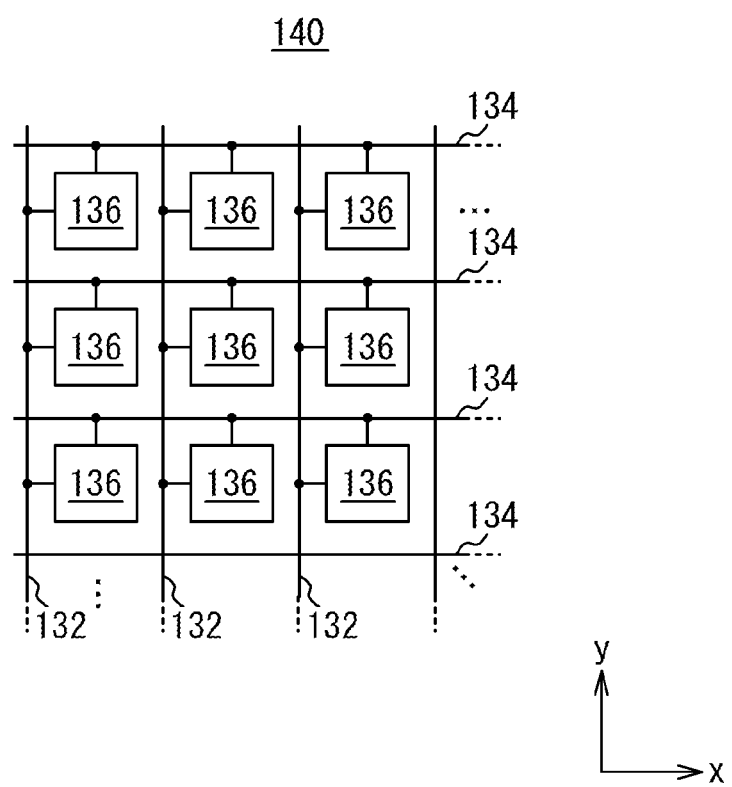
FIG. 1B illustrates an exemplary partial configuration of a display region of a display panel, according to one or more embodiments.

The display panel 100 includes a display region 140 in which a desired image is displayed under the control of the DDIC chip 200. FIG. 1B illustrates an exemplary partial configuration of the display region 140, according to one or more embodiments. In the illustrated embodiment, the display region 140 includes a plurality of data lines 132 (which may be also referred to as source lines), a plurality of scan lines 134 (which may be also referred to as gate lines), and a plurality of display elements 136. The data lines 132 are extended in the vertical direction of the display panel 100 and the scan lines 134 are extended in the horizontal direction of the display panel 100. Each display element 136 is coupled to the corresponding scan line 134 and the corresponding data line 132. In one implementation, update of a display element 136 is achieved by activating the scan line 134 coupled to the display element 136 and providing a drive signal to the corresponding data line 132, the driving signal having a signal level corresponding to the gray level defined for the display element 136. In embodiments where the display panel 100 is an OLED display panel, the display elements 136 each include an OLED element configured to emit light. Although FIG. 1B illustrates three data lines 132, three scan lines 134, and nine display elements 136, skilled persons would appreciate that the data lines 132, the scan lines 134, and the display elements 136 may be disposed in the entirety of the display region 140. Other lines (e.g., emission lines configured to control light emission from the display elements 136) may be disposed in the display region 140 depending on the configuration of the display elements 136.

Referring back to FIG. 1A, the display panel 100 further includes a driver mounting region 160. In the illustrated embodiment, the driver mounting region 160 is disposed to protrude in the vertical direction from the bottom end of the display region 140. The driver mounting region 160 is a region on which the DDIC chip 200 is mounted, the region being defined with respect to the display panel 100. In various embodiments, the driver mounting region 160 is configured to allow DDIC chips with different configurations to be mounted on the driver mounting region 160 as discussed later in details. A desired product DDIC chip selected from the DDIC chips with the different configurations is mounted on the driver mounting region 160 in the manufacturing process of the display module 1000.

Figure 2A:
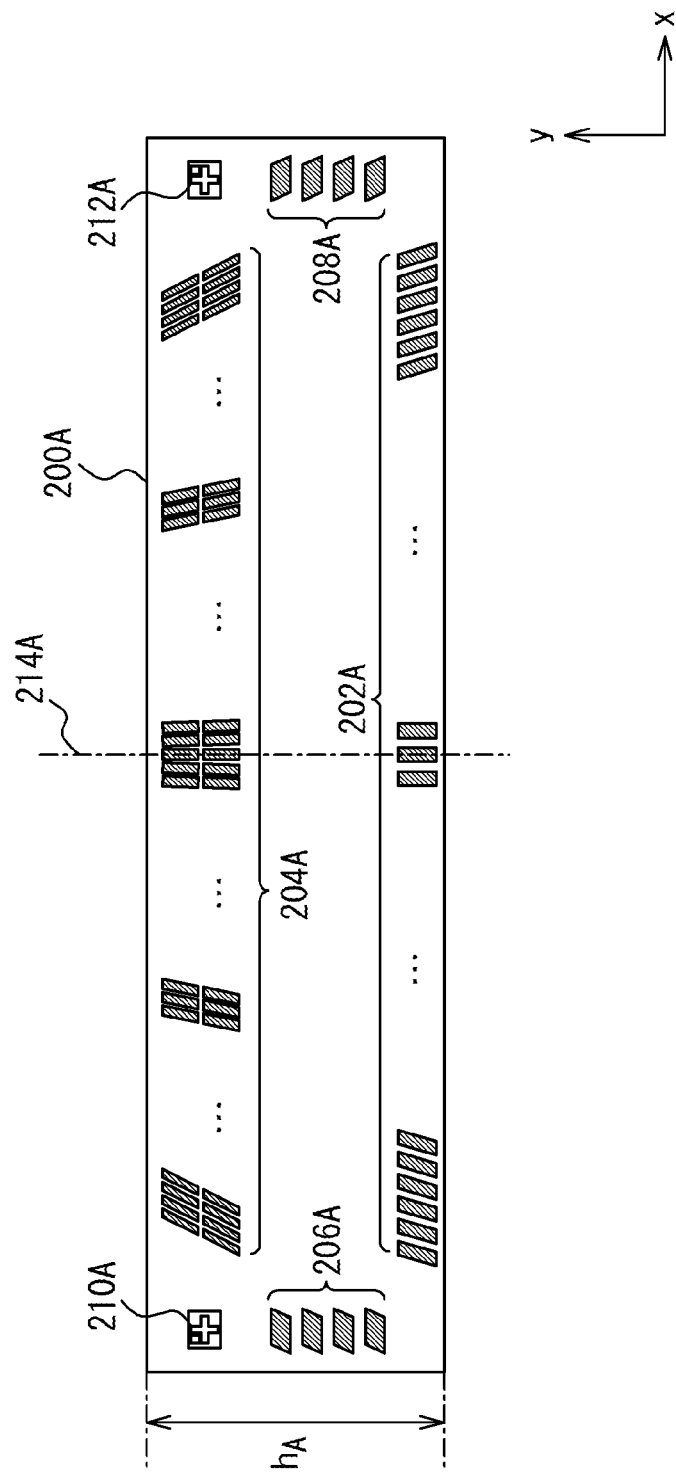

FIGS. 2A and 2B are plan views illustrating exemplary configurations of DDIC chips 200A and 200B both configured to be mounted on the driver mounting region 160, according to one or more embodiments. It is noted that the dimensions illustrated in FIGS. 2A and 2B (and other drawings) are mere examples and the dimensions may be modified in actual implementations. The DDIC chip 200A has a height $h_A$, while the DDIC chip 200B has a height $h_B$ larger than the height $h_A$. The heights $h_A$ and $h_B$ of the DDIC chips 200A and 200B may be in the order of millimeters, while the widths of the DDIC chips 200A and 200B may be in the order of millimeters to tens of millimeters. In some implementations, as illustrated in FIG. 2B, the DDIC chip 200B includes a frame memory 216 configured to store image data for an entire frame image to be displayed on the display panel 100, while the DDIC chip 200A does not include any memory capable of storing image data for an entire frame image. In one implementation, image data for an entire frame image include gray levels defined for all the display elements 136 disposed in the display region 140 of the display panel 100. The larger height $h_B$ of the DDIC chip 200B may result from the provision of the frame memory 216, which occupies a considerable area of the DDIC chip 200B. In other implementations, the DDIC chip 200A is designed with a first design rule while the second DDIC chip 200B is designed with a second design rule different from the first design rule. In one implementation, the first design rule is defined to offer a higher integration density than the second design rule. The smaller height $h_A$ of the DDIC chip 200A than the height $h_B$ of the DDIC chip 200B may result from the use of the first design rule for the DDIC chip 200A.

Referring to FIG. 2A, the DDIC chip 200A includes a plurality of input bumps 202A and a plurality of output bumps 204A, 206A, and 208A. It is noted that FIG. 2A is a top down view illustrating the input bumps 202A and the output bumps 204A, 206A, and 208A with the silicon substrate of the DDIC chip 200A illustrated as transparent. The input bumps 202A are configured to receive input signals that may carry image data corresponding to an image to be displayed on the display panel 100 and other control data that control the operation of the DDIC chip 200A. In the illustrated embodiment, the input bumps 202A are arrayed in one row along the bottom edge of the DDIC chip 200A. The output bumps 204A, 206A, and 208A are configured to output signals from the DDIC chip 200A. The signals output from the output bumps 204A may include drive signals to be provided to the data lines 132 to update selected ones of the display elements 136. The signals output from the output bumps 206A and 208A may include control signals that control scan drive circuitry (not illustrated) configured to drive the scan lines 134. In the illustrated embodiments, the output bumps 204A are arrayed in multiple rows along the top edge of the DDIC chip 200A, while the output bumps 206A and 208A are arrayed along the left and right side edges of the DDIC chip 200A, respectively.

The DDIC chip 200A further include two alignment marks 210A and 212A used to place the DDIC chip 200A at the desired position of the driver mounting region 160 of the display panel 100 during the mounting process. In the illustrated embodiments, the array of the output bumps 204A is positioned between the alignment marks 210A and 212A. The array of the output bumps 204A is positioned closer to the alignment marks 210A and 212A than the array of input bumps 202A. Further, the array of the output bumps 206A is located near the alignment mark 210A, and the array of the output bumps 208A is located near the alignment mark 212A. Numeral 214A denotes the center line of the DDIC chip 200A defined to extend in the vertical direction to pass the center of the DDIC chip 200A.

Referring to FIG. 2B, the DDIC chip 200B includes a plurality of input bumps 202B, a plurality of output bumps 204B, 206B, 208B, and two alignment marks 210B and 212B, which correspond to the input bumps 202A, the output bumps 204A, 206A, 208A, and the alignment marks 210A and 212A of the DDIC chip 200A, respectively. The layouts of the input bumps 202B, the output bumps 204B, 206B, 208B, and the alignment marks 210B and 212B in the DDIC chip 200B are similar to the corresponding components in the DDIC chip 200A except for that the relative position of the array of the input bumps 202B with respect to the alignment marks 210B and 212B is different from the relative position of the array of the input bumps 202A with respect to the alignment marks 210A and 212A. The relative positions of the arrays of the output bumps 204B, 206B, and 208B with respect to the alignment marks 210B and 212B are identical to the relative positions of the arrays of the output bumps 204A, 206A, and 208A with respect to the alignment marks 210A and 212A, respectively. In contrast, the relative position of the array of the input bumps 202B with respect to the alignment marks 210B and 212B is different from the relative position of the array of the input bumps 202A with respect to the alignment marks 210A and 212A. In one implementation, the distance between the alignment mark 210B and the array of the input bumps 202B in the vertical direction (indicated as the y-axis direction in FIG. 2B) of the DDIC chip 200B is larger than the distance between the alignment mark 210A and the array of the input bumps 202A in the vertical direction (indicated as the y-axis direction in FIG. 2A) of the DDIC chip 200A.

FIG. 3 is a plan view illustrating an example configuration of the driver mounting region 160 of the display panel 100, according to one or more embodiments. The driver mounting region 160 includes a plurality of outer lead bonding (OLB) electrodes 101, a plurality of ILB electrodes 102, and a plurality of routing traces 103. The OLB electrodes 101, the ILB electrodes 102, and the routing traces 103 are formed on the plastic substrate 120 (illustrated in FIG. 1A). The OLB electrodes 101 are used to provide electrical connections to an entity external to the display module 1000, such as a flexible printed circuit board. In one implementation, conductive pads disposed on a flexible printed circuit board are bonded to the OLB electrodes 101. In the illustrated embodiment, the OLB electrodes 101 are disposed at the bottom end edge 160a of the driver mounting region 160, where the bottom end edge 160a is directed in the horizontal direction (illustrated as the x-axis direction) of the display panel 100. The ILB electrodes 102 are configured to be adapted to both the input bumps 202A and 202B of the DDIC chips 200A and 200B. Details of the ILB electrodes 102 will be described later. The routing traces 103 are configured to provide electrical connections between the OLB electrodes 101 and the ILB electrodes 102. The ILB electrodes 102 are electrically connected to the OLB electrodes 101 via the routing traces 103, respectively.

The driver mounting region 160 further includes output lead bonding electrodes 104, 106, and 108 configured to be bonded to the output bumps 204A, 206A, 208A of the DDIC chip 200A and the output bumps 204B, 206B, 208B of the DDIC chip 200B. The output lead bonding electrodes 104, 106, and 108 are also formed on the plastic substrate 120. In various implementation, at least part of the output lead bonding electrodes 104 are electrically connected to the data lines 132 with routing traces (not illustrated), and at least part of the output lead bonding electrodes 106 and 108 are electrically connected to the scan driver circuitry configured to drive the scan lines 134 with routing traces (not illustrated).

The driver mounting region 160 further includes two alignment marks 110 and 112 used to achieve alignment of the DDIC chip 200A or 200B to the driver mounting region 160 during the mounting process. When the DDIC chip 200A is mounted on the driver mounting region 160, the position of the DDIC chip 200A is adjusted such that the alignment marks 210A and 212A of the DDIC chip 200A are aligned with the alignment marks 110 and 112 of the driver mounting region 160. Correspondingly, when the DDIC chip 200B is mounted on the driver mounting region 160, the position of the DDIC chip 200B is adjusted such that the alignment marks 210B and 212B of the DDIC chip 200B are aligned with the alignment marks 110 and 112. In other embodiments, three or more alignment marks may be disposed in the driver mounting region 160. In such embodiments, the same number of the alignment marks may be disposed on the DDIC chips 200A and 200B.

Numeral 114 denotes a vertical reference line defined for the driver mounting region 160. When the alignment marks 210A and 212A of the DDIC chip 200A are aligned with the alignment marks 110 and 112 of the driver mounting region 160, the center line 214A of the DDIC chip 200A is also aligned with the vertical reference line 114. Correspondingly, when the alignment marks 210B and 212B of the DDIC chip 200B are aligned with the alignment marks 110 and 112 of the driver mounting region 160, the center line 214B of the DDIC chip 200B is also aligned with the vertical reference line 114.

Figure 4:
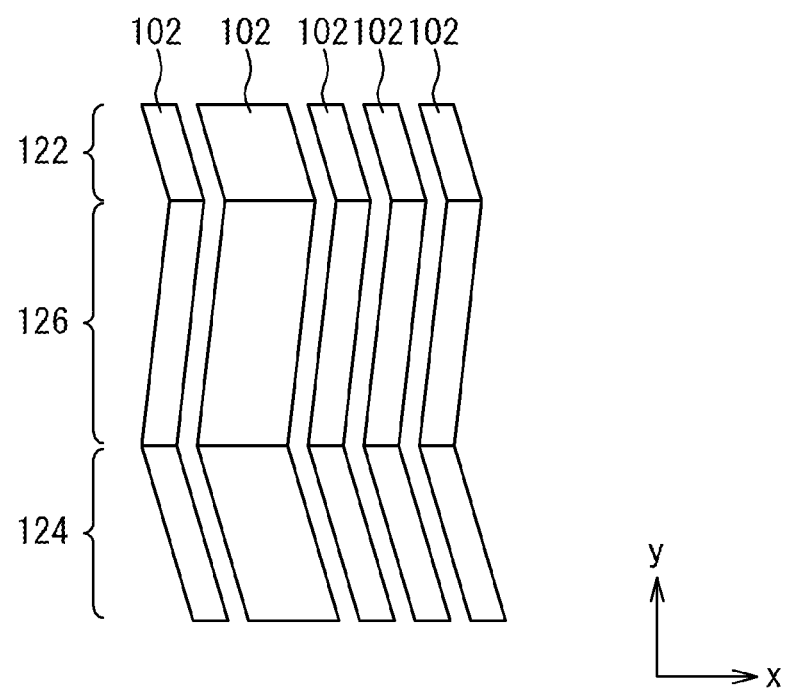
FIG. 4 is a plan view illustrating example configurations of inner lead bonding (ILB) electrodes of a display panel, according to one or more embodiments.

FIG. 4 is a plan view illustrating example configurations of the ILB electrodes 102, according to one or more embodiments. In the illustrated embodiments, each ILB electrode 102 includes a first bonding segment 122, a second bonding segment 124, and a connection segment 126. The first bonding segment 122 of each ILB electrode 102 is configured to be bonded to a corresponding one of the input bumps 202A of the DDIC chip 200A, and the second bonding segment 124 of each ILB electrode 102 is configured to be bonded to a corresponding one of the input bumps 202B of the DDIC chip 200B. The connection segment 126 of each ILB electrode 102 is configured to provide an electrical connection between the first bonding segment 122 and the second bonding segment 124.

Figure 5:
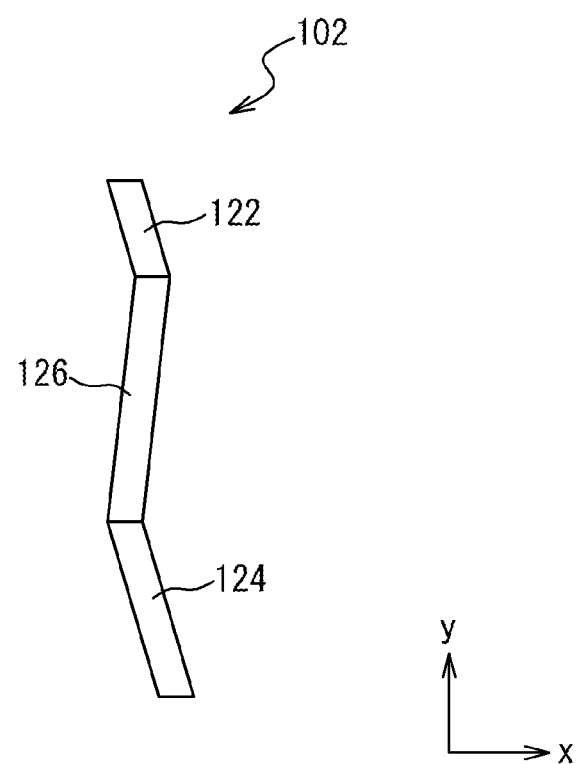
FIG. 5 is a plan view illustrating an example configuration of an ILB electrode, according to one or more embodiments.

FIG. 5 is a plan view illustrating an example configuration of an ILB electrode 102, according to one or more embodiments. In the illustrated embodiment, an end of the first bonding segment 122 of the ILB electrode 102 is coupled to one end of the connection segment 126, and the other end of the connection segment 126 is coupled to an end of the second bonding segment 124. With respect to an ILB electrode 102 other than the ILB electrode 102 positioned aligned with the vertical reference line 114 (also see FIG. 3), the first bonding segment 122 is extended in a first direction oblique to the vertical direction of the display panel 100, and the connection segment 126 is extended in a second direction different from the first direction, where the vertical direction is illustrated as the y-axis direction in FIG. 5. In various implementations, the second direction is oblique to the vertical direction of the display panel 100. The second bonding segment 124 of each ILB electrode 102 is extended in the same direction as the first bonding segment 122 of that ILB electrode 102. As will be discussed later in detail, the ILB electrodes 102 are configured such that the directions in which the first bonding segments 122 and the second bonding segments 124 are extended vary depending on the locations of the ILB electrodes 102 to mitigate the effect of thermal expansion of the plastic substrate 120 during the mounting process to bond the DDIC chip 200A or 200B.

In the embodiments illustrated in FIGS. 3 to 5, the ILB electrodes 102 are configured such that the input bumps 202A of the DDIC chip 200A and the input bumps 202B of the DDIC chip 200B are both successfully bonded to the ILB electrodes 102 by using the alignment marks 110 and 112 of the driver mounting region 160, although the relative position of the array of the input bumps 202A with respect to the alignment marks 210A and 212A is different from the relative position of the array of the input bumps 202B with respect to the alignment marks 210B and 212B. The provision of the first bonding segments 122 for the ILB electrodes 102 achieves bonding the input bumps 202A of the DDIC chip 200A to the ILB electrodes 102 by aligning the alignment marks 210A and 212A of the DDIC chip 200A with the alignment marks 110 and 112. Furthermore, the provision of the second bonding segments 124 for the ILB electrodes 102 achieves bonding the input bumps 202B of the DDIC chip 200B to the ILB electrodes 102 by aligning the alignment marks 210B and 212B of the DDIC chip 200B with the alignment marks 110 and 112.

FIG. 6A is a plan view illustrating example positioning of the DDIC chip 200A on the driver mounting region 160 of the display panel 100, according to one or more embodiments. The DDIC chip 200A is bonded to the driver mounting region 160 such that the alignment marks 210A and 212A of the DDIC chip 200A are aligned with the alignment marks 110 and 112 of the driver mounting region 160, respectively. Aligning the alignment marks 210A and 212A with the alignment marks 110 and 112 allows the respective bumps of the DDIC chip 200A to be bonded to desired counterparts disposed on the driver mounting region 160. More specifically, the input bumps 202A of the DDIC chip 200A are bonded to the first bonding segments 122 of the ILB electrodes 102 disposed on the driver mounting region 160. Further, the output bumps 204A, 206A, and 208A of the DDIC chip 200A are bonded to the output lead bonding electrodes 104, 106, and 108 disposed on the driver mounting region 160, respectively. The center line 214A of the DDIC chip 200A is aligned with the vertical reference line 114 defined for the driver mounting region 160 in the state in which the DDIC chip 200A is bonded to the driver mounting region 160.

Figure 6B:
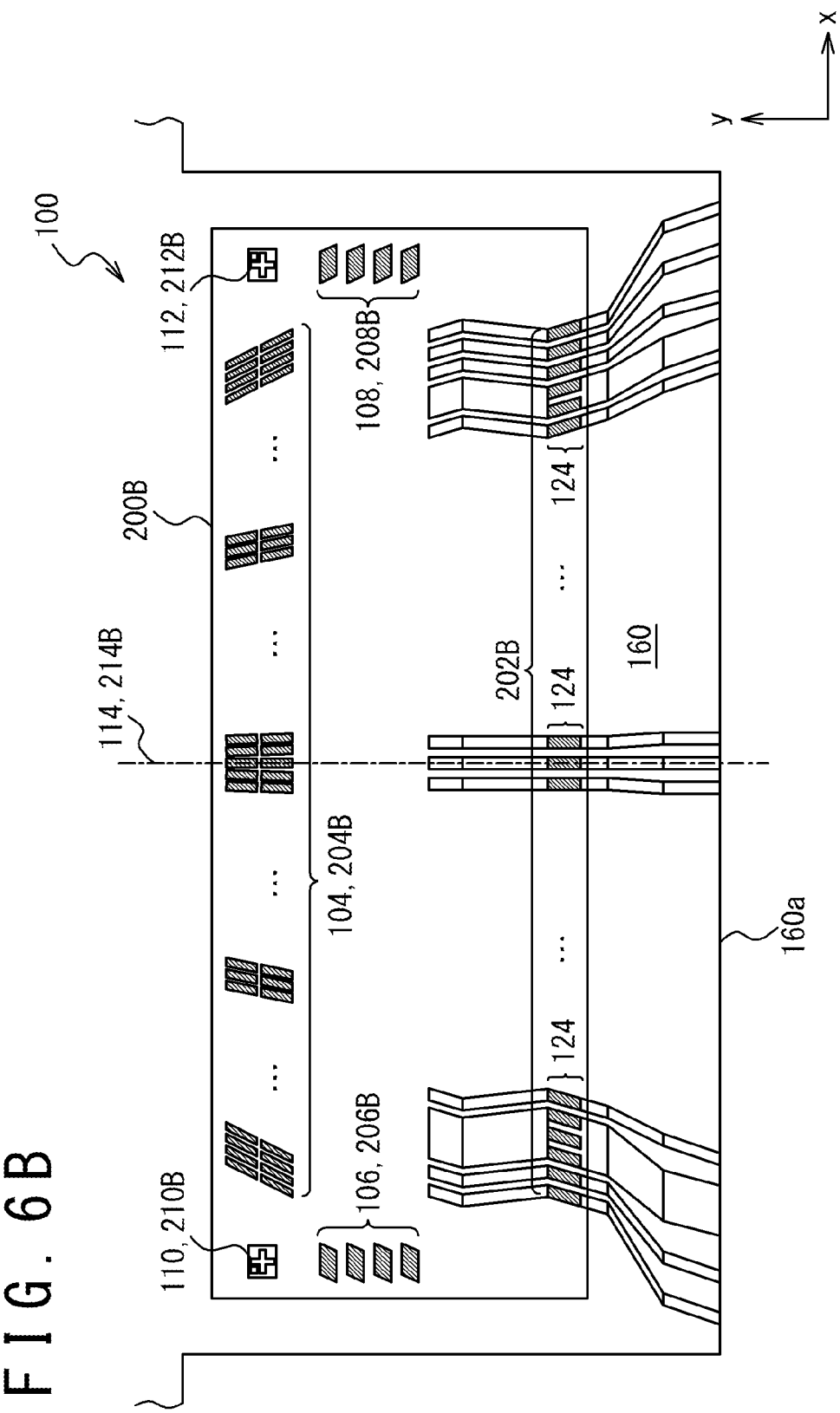

FIG. 6B is a plan view illustrating example positioning of the DDIC chip 200B on the driver mounting region 160 of the display panel 100, according to one or more embodiments. The DDIC chip 200B is bonded to the driver mounting region 160 such that the alignment marks 210B and 212B of the DDIC chip 200B are aligned with the alignment marks 110 and 112 of the driver mounting region 160, respectively. Aligning the alignment marks 210B and 212B with the alignment marks 110 and 112 allows the respective bumps of the DDIC chip 200B to be bonded to desired counterparts disposed on the driver mounting region 160. More specifically, the input bumps 202B of the DDIC chip 200B are bonded to the second bonding segments 124 of the ILB electrodes 102 disposed on the driver mounting region 160. Further, the output bumps 204B, 206B, and 208B of the DDIC chip 200B are bonded to the output lead bonding electrodes 104, 106, and 108 disposed on the driver mounting region 160, respectively. The center line 214B of the DDIC chip 200B is aligned with the vertical reference line 114 defined for the driver mounting region 160 in the state in which the DDIC chip 200B is bonded to the driver mounting region 160.

One issue in mounting a DDIC chip 200A or 200B on the display panel 100 may be heat expansion of the plastic substrate 120 during the mounting process. In embodiments where anisotropic conductive films (ACF) are used to bond the DDIC chip 200A or 200B on the display panel 100, for example, the plastic substrate 120 of the display panel 100 is heated during the bonding. As the plastic substrate 120 often exhibits a large heat expansion, the difference in the heat expansion between the plastic substrate 120 and the DDIC chip 200A or 200B (which generally includes a silicon substrate) may make it difficult to align bumps on the DDIC chip 200A or 200B with desired electrodes on the plastic substrate.

Figure 7:
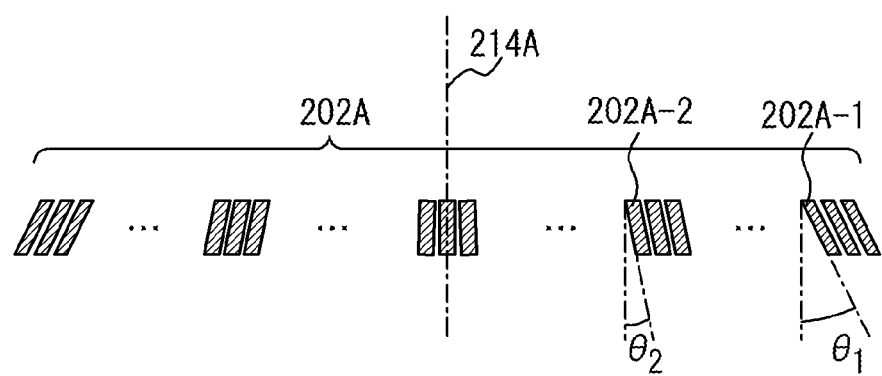
FIG. 7 is a plan view illustrating an example layout of input bumps of a DDIC chip, according to one or more embodiments.
Figure 8:
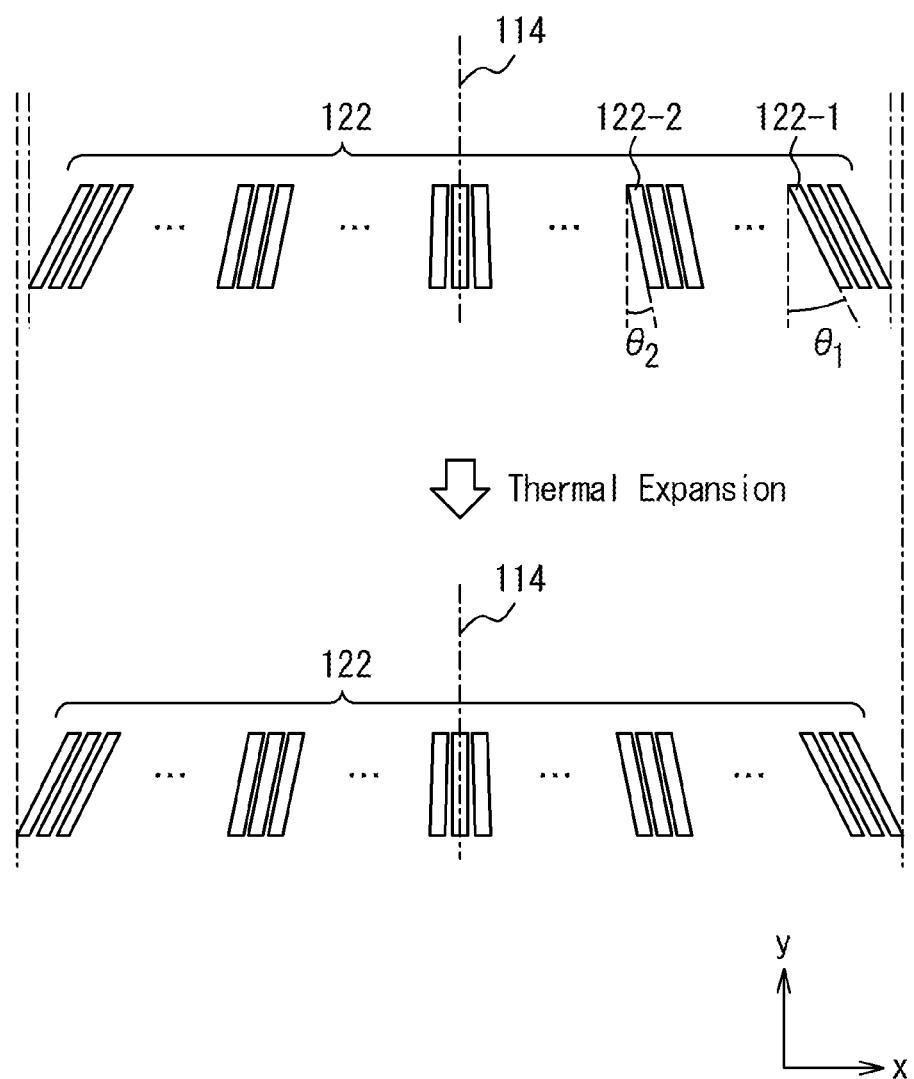
FIG. 8 is a plan view illustrating an example layout of first bonding segments of ILB electrodes of a display panel, according to one or more embodiments.

In one or more embodiments, the layout of the input bumps 202A and 202B of the DDIC chip 200A and 200B and the layout of the ILB electrodes 102 of the display panel 100 are designed to mitigate the effect of the heat expansion difference. FIG. 7 is a plan view illustrating an example layout of the input bumps 202A of the DDIC chip 200A, according to one or more embodiments, and FIG. 8 is a plan view illustrating an example layout of the first bonding segments 122 of the ILB electrodes 102 of the display panel 100, according to one or more embodiments. It is noted that the second bonding segments 124 and the connection segments 126 are not illustrated in FIG. 8 for simplicity. It is also noted that the input bumps 202B of the DDIC chip 200B are designed identically to the input bumps 202A of the DDIC chip 200A.

Referring to FIG. 7, in one or more embodiments, at least part of the input bumps 202A of the DDIC chip 200A are configured to extend in oblique directions with respect to the center line 214A of the DDIC chip 200A, where the center line 214A is directed in the vertical direction of the display panel 100 when the DDIC chip 200A is bonded on the display panel 100. In the illustrated embodiment, the input bumps 202A other than the input bump 202A disposed on the center line 214A are configured to extend in oblique directions with respect to the center line 214A. In various embodiments, the acute angles formed between the center line 214A and the directions in which the input bumps 202A are extended increase as the distance from the center line 214A increases. The angles formed between the center line 214A and the directions in which the input bumps 202A are extended may be in a range from 0 to 45 degrees. For example, the input bump 202A-1 is positioned further from the center line 214A than the input bump 202A-2, and the acute angle $\theta_1$ formed between the center line 214A and the direction in which the input bump 202A-1 is extended is larger than the acute angle $\theta_2$ formed between the center line 214A and the direction in which the input bump 202A-2 is extended.

Referring to FIG. 8, at least part of the first bonding segments 122 of the ILB electrodes 102 are configured to extend in oblique directions with respect to the vertical reference line 114 defined for the driver mounting region 160, in one or more embodiments. It is noted that the center line 214A of the DDIC chip 200A is aligned with the vertical reference line 114 when the DDIC chip 200A is bonded on the driver mounting region 160, and the center line 214B of the DDIC chip 200B is aligned with the vertical reference line 114 when the DDIC chip 200B is bonded on the driver mounting region 160. In the illustrated embodiment, the first bonding segments 122 of the ILB electrodes 102 other than that of the ILB electrode 102 disposed on the vertical reference line 114 are configured to extend in oblique directions with respect to the vertical reference line 114. In various embodiments, the acute angles formed between the vertical reference line 114 and the directions in which the first bonding segments 122 are extended increase as the distance from the vertical reference line 114 increases.

In one or more embodiments, the acute angle formed between the vertical reference line 114 and the direction in which each first bonding segment 122 is extended is identical to the acute angle formed between the center line 214A and the direction in which the corresponding input bump 202A is extended. For the configurations illustrated in FIG. 7 and FIG. 8, for example, the input bump 202A-1 is bonded to the first bonding segment 122-1 when the DDIC chip 200A is mounted on the display panel 100. The acute angle formed between the vertical reference line 114 and the direction in which the first bonding segment 122-1 is extended is $\theta_1$, which is identical to the acute angle formed between the center line 214A and the direction in which the input bump 202A-1 is extended. The same applies to the first bonding segment 122-2 and the input bump 202A-2, which are bonded together when the DDIC chip 200A is mounted on the display panel 100. The acute angle formed between the vertical reference line 114 and the direction in which the first bonding segment 122-2 is extended is $\theta_2$, which is identical to the acute angle formed between the center line 214A and the direction in which the input bump 202A-2 is extended.

Figure 9:
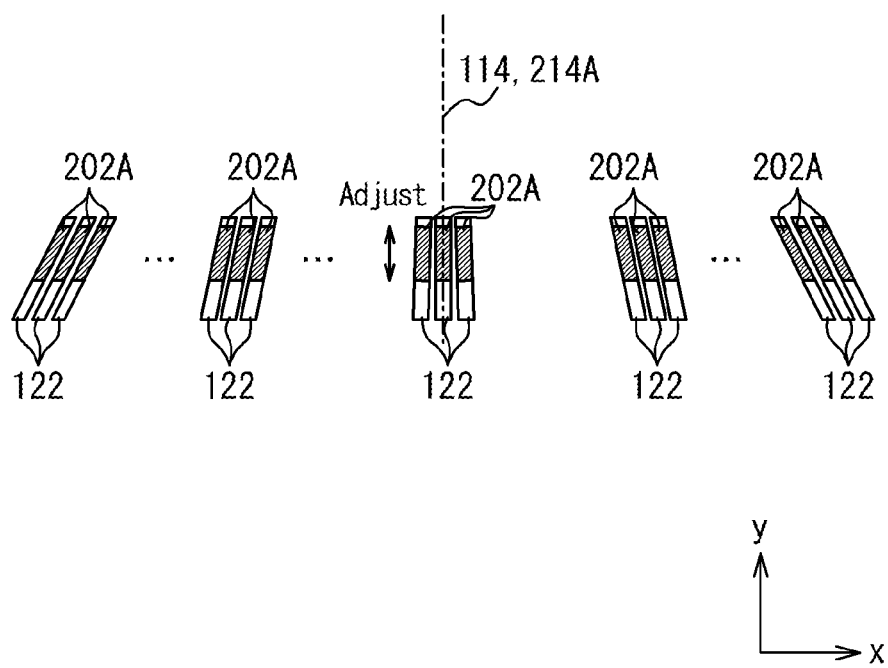
FIG. 9 illustrates example alignment of input bumps of a DDIC chip and first bonding segments of ILB electrodes of a display panel, according to one or more embodiments.

The layouts illustrated in FIG. 7 and FIG. 8 may effectively mitigate the effect of the difference in the thermal expansion between the plastic substrate 120 and the DDIC chip 200A. The plastic substrate 120 exhibits a larger thermal expansion than the DDIC chip 200A when the plastic substrate 120 is heated during the mounting process, causing larger displacements of the first bonding segments 122 than those of the input bumps 202A. The bottom part of FIG. 8 illustrates example displacements of the first bonding segments 122. In one or more embodiments, as illustrated in FIG. 9, the difference in the displacement between the first bonding segments 122 and the input bumps 202A are absorbed by adjusting the position of the DDIC chip 200A in the vertical direction of the display panel 100 (which is illustrated as the y-axis direction in FIG. 9). The adjustment of the position of the DDIC chip 200A in the vertical direction allows reliably bonding the DDIC chip 200A on the display panel 100.

The above-described discussion also applies to the input bumps 202B of the DDIC chip 200B and the second bonding segments 124 of the ILB electrodes 102 of the display panel 100. In one or more embodiments, the acute angles formed between the center line 214B of the DDIC chip 200B and the directions in which the input bumps 202B are extended increase as the distance from the center line 214B increases. The acute angles formed between the vertical reference line 114 and the directions in which the second bonding segments 124 are extended increase as the distance from the vertical reference line 114 increases. The acute angle formed between the vertical reference line 114 and the direction in which each first bonding segment 122 is extended is identical to the acute angle formed between the center line 214B and the direction in which the corresponding input bump 202B is extended. The difference in the displacement between the second bonding segments 124 and the input bumps 202B of the DDIC chip 200B are absorbed by adjusting the position of the DDIC chip 200B in the vertical direction of the display panel 100.

Figure 10:
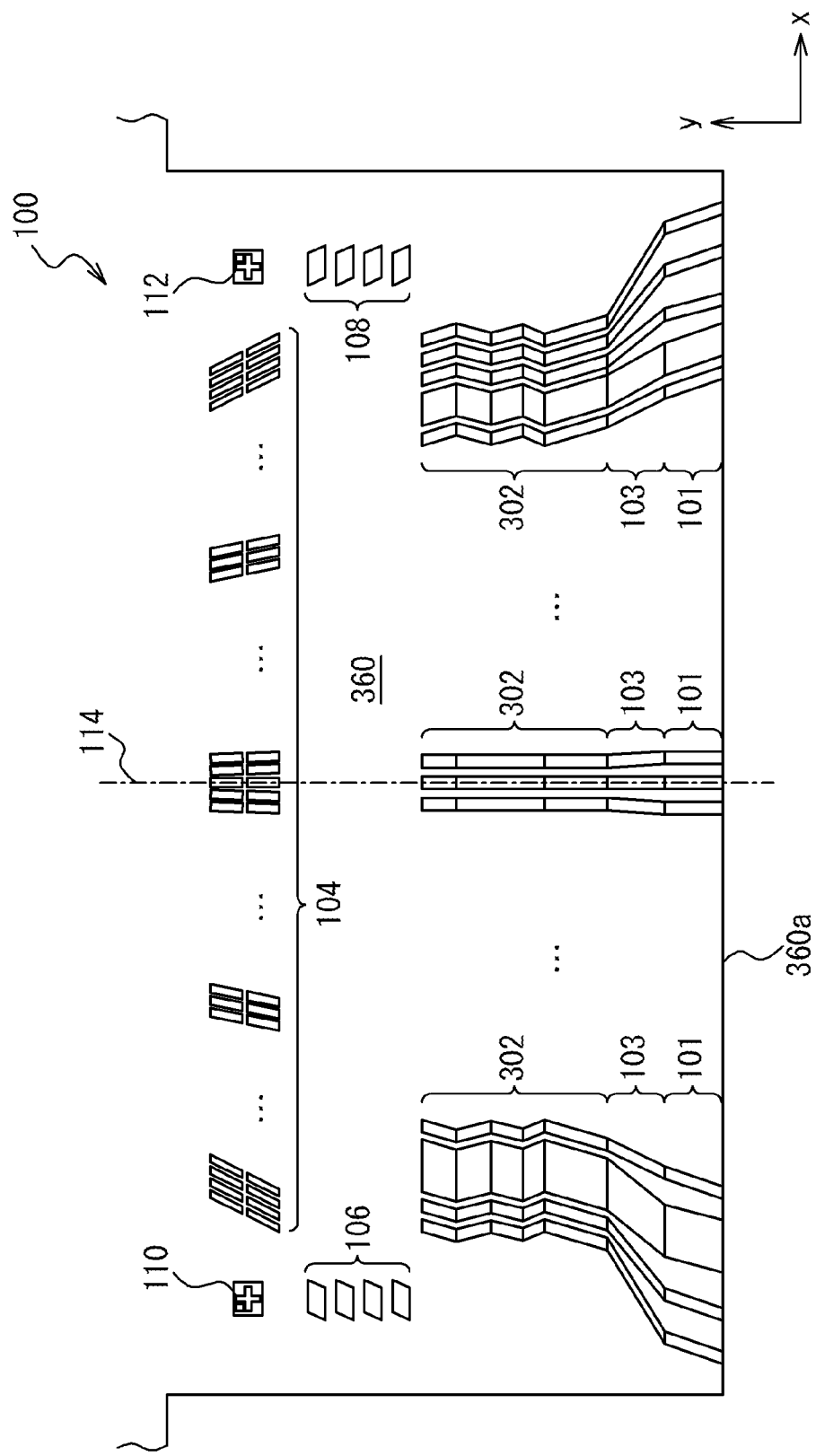
FIG. 10 is a plan view illustrating an example configuration of a driver mounting region of a display panel, according to one or more embodiments.

FIG. 10 is a plan view illustrating an example configuration of the driver mounting region, denoted by numeral 360, of the display panel 100, according to other embodiments. The driver mounting region 360 is configured to allow three DDIC chips with different configurations to be mounted on the driver mounting region 360. In one implementation, the driver mounting region 360 is configured such that the DDIC chip 200A (illustrated in FIG. 2A) and the DDIC chip 200B (illustrated in FIG. 2B) can be mounted on the driver mounting region 360.

Figure 11:
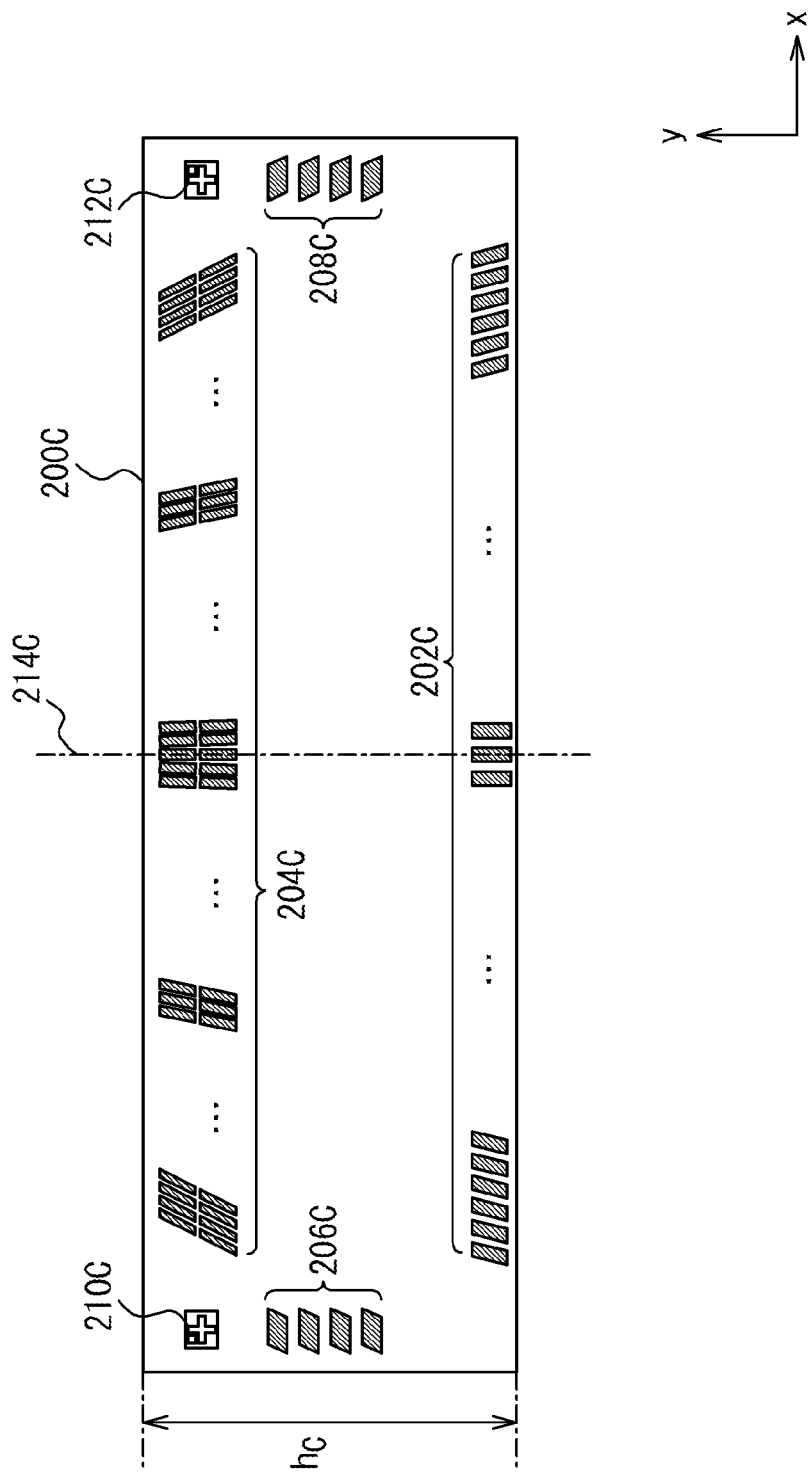
FIG. 11 is a plan view illustrating an example configuration of a DDIC chip, according to one or more embodiments.

The driver mounting region 360 is further configured such that a DDIC chip 200C illustrated in FIG. 11 can be mounted on the driver mounting region 360. The DDIC chip 200C has a height $h_C$ that is larger than the height $h_A$ of the DDIC chip 200A and smaller than the height $h_B$ of the DDIC chip 200B. The DDIC chip 200C includes a plurality of input bumps 202C, a plurality of output bumps 204C, 206C, 208C, and two alignment marks 210C and 212C, which correspond to the input bumps 202A, the output bumps 204A, 204A, 206A, 208A, and the alignment marks 210A and 212A of the DDIC chip 200A, respectively. The arrangements of the input bumps 202C, the output bumps 204C, 206C, 208C, and the alignment marks 210C and 212C in the DDIC chip 200C are identical to the corresponding components in the DDIC chip 200A except for that the relative position of the array of the input bumps 202C with respect to the alignment marks 210C and 212C is different from the relative position of the array of the input bumps 202A with respect to the alignment marks 210A and 212A. The relative position of the array of the input bumps 202C with respect to the alignment marks 210C and 212C is also different from the relative position of the array of the input bumps 202B with respect to the alignment marks 210B and 212B of the DDIC chip 200B. The relative positions of the arrays of the output bumps 204C, 206C, and 208C with respect to the alignment marks 210C and 212C are identical to the relative positions of the arrays of the output bumps 204A, 206A, and 208A with respect to the alignment marks 210A and 212A, respectively, as is the case with the relative positions of the arrays of the output bumps 204B, 206B, and 208B with respect to the alignment marks 210B and 212B.

Figure 12:
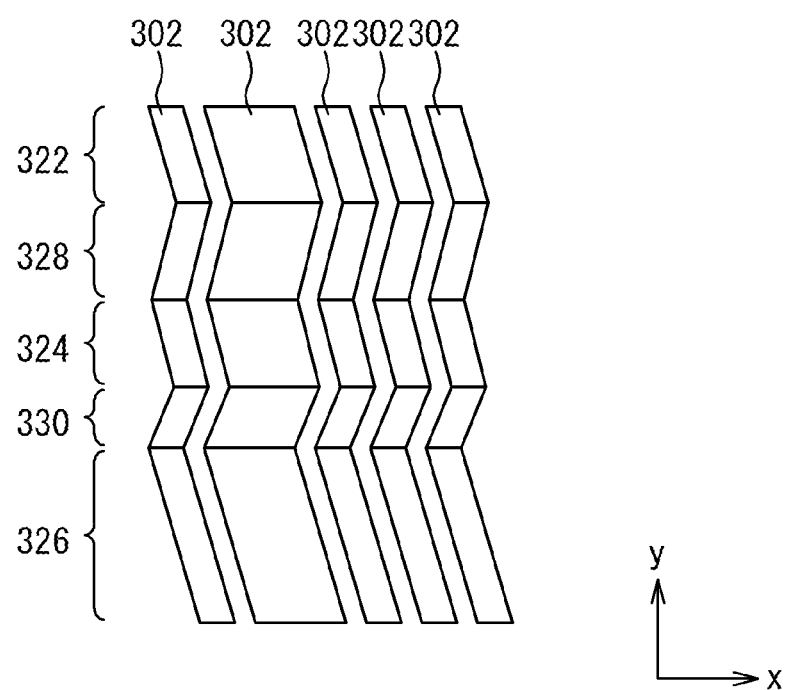
FIG. 12 is a plan view illustrating example configurations of ILB electrodes of a display panel, according to one or more more embodiments.

Referring back to FIG. 10, in one implementation, the driver mounting region 360 includes a plurality of ILB electrodes 302, which are configured differently from the ILB electrodes 102 illustrated in FIG. 3. FIG. 12 illustrates example configurations of the ILB electrodes 302, according to one or more embodiments. In the illustrated embodiments, each ILB electrode 302 includes a first bonding segment 322, a second bonding segment 324, a third bonding segment 326, a first connection segment 328, and a second connection segment 330. The first bonding segment 322 of each ILB electrode 302 is configured to be bonded to a corresponding one of the input bumps 202A of the DDIC chip 200A; the second bonding segment 324 of each ILB electrode 302 is configured to be bonded to a corresponding one of the input bumps 202C of the DDIC chip 200C; and the third bonding segment 326 of each ILB electrode 302 is configured to be bonded to a corresponding one of the input bumps 202B of the DDIC chip 200B. The first connection segment 328 of each ILB electrode 302 is configured to provide an electrical connection between the first bonding segment 322 and the second bonding segment 324, and the second connection segment 330 of each ILB electrode 302 is configured to provide an electrical connection between the second bonding segment 324 and the third bonding segment 326.

Figure 13:
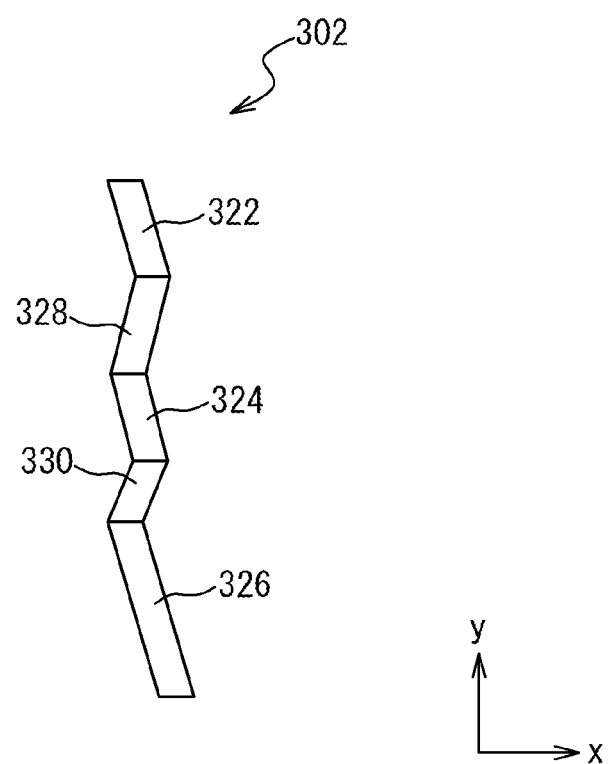
FIG. 13 is a plan view illustrating an example configuration of an ILB electrode, according to one or more embodiments.

FIG. 13 illustrates an example configuration of an ILB electrode 302, according to one or more embodiments. The first bonding segment 322, the first connection segment 328, the second bonding segment 324, the second connection segment 330, and the third bonding segment 326 are connected in sequence. An end of the first bonding segment 322 of the ILB electrode 302 is coupled to one end of the first connection segment 328, and the other end of the first connection segment 328 is coupled to one end of the second bonding segment 324. The other end of the second bonding segment 324 is coupled to one end of the second connection segment 330, and the other end of the second connection segment 330 is coupled to an end of the third bonding segment 326.

With respect to an ILB electrode 302 other than the ILB electrode 302 positioned aligned with the vertical reference line 114, the first bonding segment 322 is extended in a first direction oblique to the vertical direction of the display panel 100, where the vertical direction is illustrated as the y-axis direction in FIG. 13. In various implementations, the second bonding segment 324 and the third bonding segment 326 of each ILB electrode 302 are extended in the same direction as the first bonding segment 322 of that ILB electrode 302. The first connection segment 328 is extended in a second direction different from the first direction, the second connection segment 330 is extended in a third direction different from the first direction. To mitigate the effect of thermal expansion of the plastic substrate 120 during the mounting process, in one or more embodiments, the ILB electrodes 302 are configured such that the directions in which the first bonding segments 322, the second bonding segments 324, and the third bonding segments 326 are extended vary depending on the locations of the ILB electrodes 302 as discussed in relation to the first bonding segments 122 and the second bonding segments 124 of the ILB electrodes 102.

FIG. 14A illustrates example positioning of the DDIC chip 200A on the driver mounting region 360 of the display panel 100, according to one or more embodiments. The DDIC chip 200A is bonded to the driver mounting region 360 such that the alignment marks 210A and 212A of the DDIC chip 200A are aligned with the alignment marks 110 and 112 of the driver mounting region 360, respectively. The input bumps 202A of the DDIC chip 200A are bonded to the first bonding segments 322 of the ILB electrodes 302 disposed on the driver mounting region 360. Further, the output bumps 204A, 206A, and 208A of the DDIC chip 200A are bonded to the output lead bonding electrodes 104, 106, and 108 disposed on the driver mounting region 360, respectively. The center line 214A of the DDIC chip 200A is aligned with the vertical reference line 114 defined for the driver mounting region 360 in the state in which the DDIC chip 200A is bonded to the driver mounting region 360.

Figure 14B:
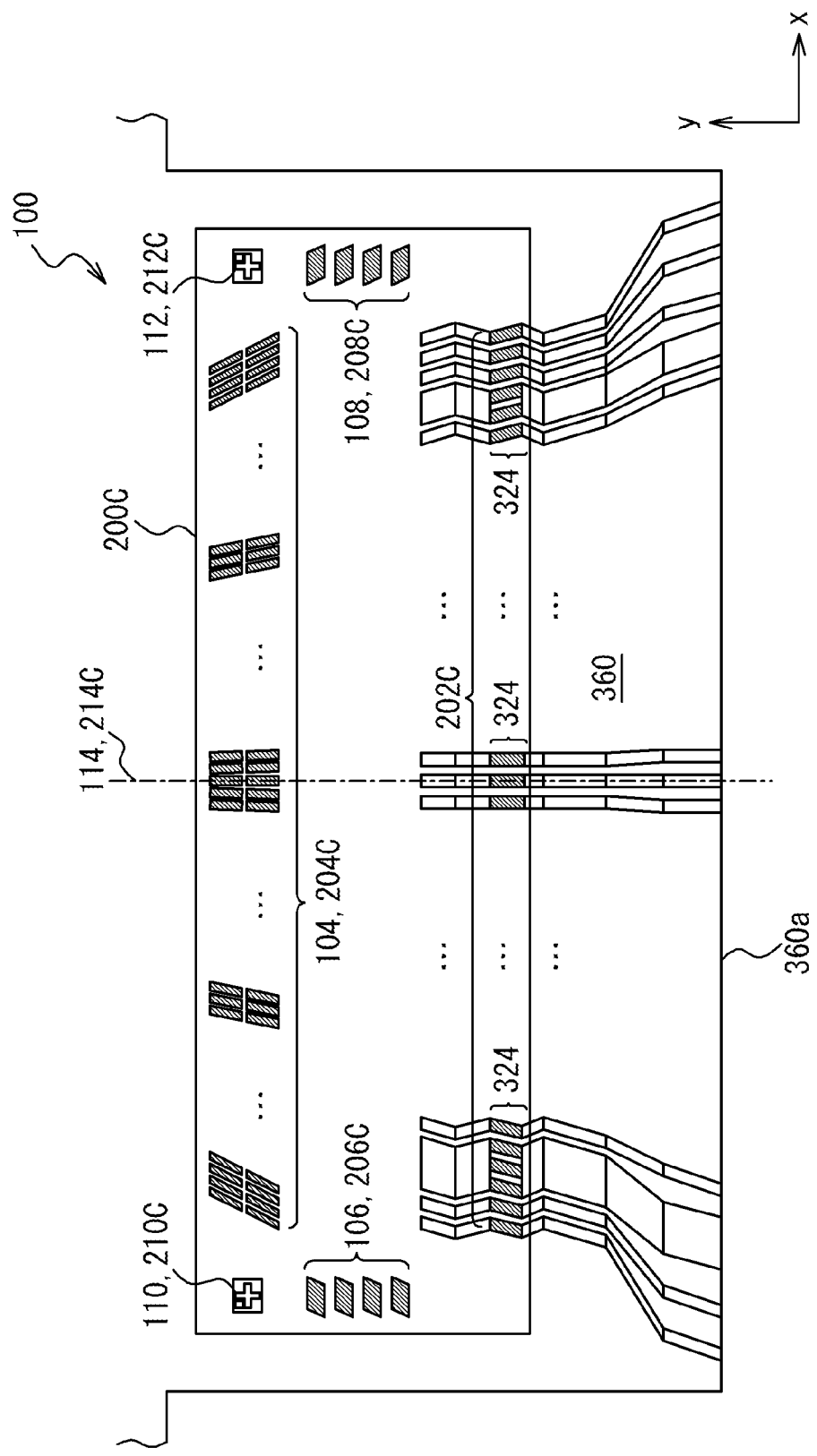

FIG. 14B illustrates example positioning of the DDIC chip 200C on the driver mounting region 360 of the display panel 100, according to one or more embodiments. The DDIC chip 200C is bonded to the driver mounting region 360 such that the alignment marks 210C and 212C of the DDIC chip 200C are aligned with the alignment marks 110 and 112 of the driver mounting region 360, respectively. The input bumps 202C of the DDIC chip 200C are bonded to the second bonding segments 324 of the ILB electrodes 302 disposed on the driver mounting region 360. Further, the output bumps 204C, 206C, and 208C of the DDIC chip 200C are bonded to the output lead bonding electrodes 104, 106, and 108 disposed on the driver mounting region 360, respectively. The center line 214C of the DDIC chip 200C is aligned with the vertical reference line 114 defined for the driver mounting region 360 in the state in which the DDIC chip 200C is bonded to the driver mounting region 360.

Figure 14C:
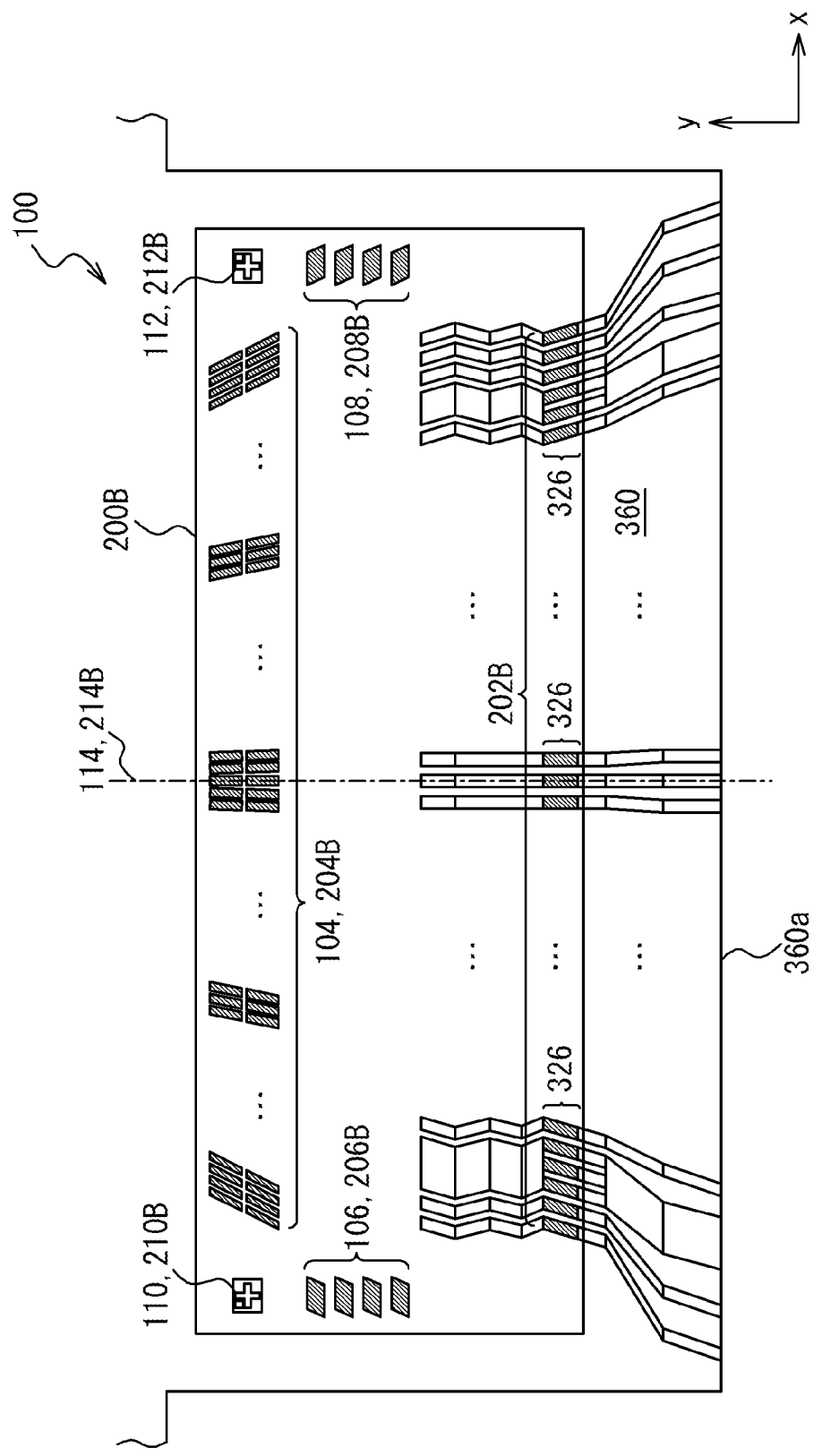

FIG. 14C illustrates example positioning of the DDIC chip 200B on the driver mounting region 360 of the display panel 100, according to one or more embodiments. The DDIC chip 200B is bonded to the driver mounting region 360 such that the alignment marks 210B and 212B of the DDIC chip 200B are aligned with the alignment marks 110 and 112 of the driver mounting region 360, respectively. The input bumps 202B of the DDIC chip 200B are bonded to the third bonding segments 326 of the ILB electrodes 302 disposed on the driver mounting region 360. Further, the output bumps 204B, 206B, and 208B of the DDIC chip 200B are bonded to the output lead bonding electrodes 104, 106, and 108 disposed on the driver mounting region 360, respectively. The center line 214B of the DDIC chip 200B is aligned with the vertical reference line 114 defined for the driver mounting region 360 in the state in which the DDIC chip 200B is bonded to the driver mounting region 360.

Figure 15:
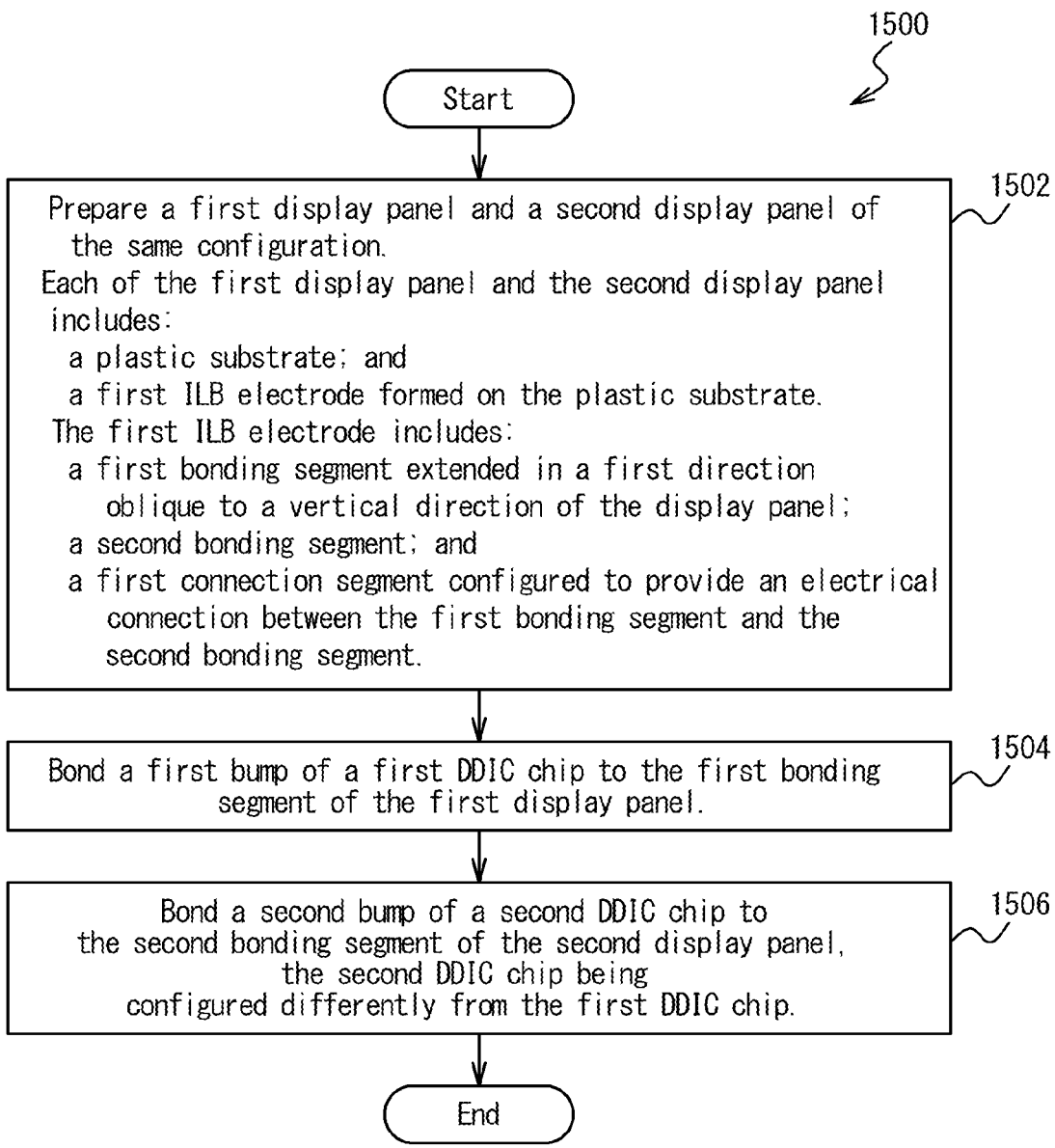
FIG. 15 is a flowchart illustrating an example method for preparing display modules, according to one or more embodiments.

Method 1500 of FIG. 15 illustrates steps for preparing display modules (e.g., the display module 1000 illustrated in FIG. 1), according to one or more embodiments. It should be noted that the order of the steps may be altered from the order illustrated.

At step 1502, a first display panel and a second display panel of the same configuration are prepared. A respective one of the first display panel and the second display panel includes a plastic substrate (e.g., the plastic substrate 120 illustrated in FIG. 1) and a first ILB electrode (e.g., the ILB electrodes 102 illustrated in FIG. 3 and the ILB electrodes 302 illustrated in FIG. 10). The first ILB electrode includes a first bonding segment, a second bonding segment, and a first connection segment. The first bonding segment is extended in a first direction oblique to the vertical direction of the respective display panel. The first connection segment may be extended in a second direction different from the first direction to provide an electrical connection between the first bonding segment and the second bonding segment. The second bonding segment may be extended in the first direction, that is, the same direction in which the first bonding segment is extended.

At step 1504, a first bump of a first DDIC chip (e.g., the DDIC chip 200A illustrated in FIG. 2A) is bonded to the first bonding segment of the first display panel. At step 1506, a second bump of a second DDIC chip (e.g., the DDIC chip 200B illustrated in FIG. 2B and the DDIC chip 200C illustrated in FIG. 11) is bonded to the second bonding segment of the second display panel. The second DDIC chip is configured differently from the first DDIC chip.

While many embodiments have been described, those skilled in the art, having benefit of this disclosure, will appreciate that other embodiments can be devised which do not depart from the scope. Accordingly, the scope of the invention should be limited only by the attached claims.

What is claimed is:

1. A display panel, comprising:
a plastic substrate; and
a first inner lead bonding (ILB) electrode on the plastic substrate,
wherein the first ILB electrode comprises:
a first bonding segment extended in a first direction oblique to a vertical direction of the display panel,
a second bonding segment, wherein the second bonding segment is extended in the first direction, and
a first connection segment configured to provide an electrical connection between the first bonding segment and the second bonding segment,
wherein the first ILB electrode is configured to be bonded to an integrated circuit chip using one of the first bonding segment or the second bonding segment.

2. The display panel of claim 1, wherein the first connection segment is extended in a second direction different from the first direction.

3. The display panel of claim 1, further comprising a second ILB electrode formed on the plastic substrate,
wherein the second ILB electrode comprises:
a third bonding segment extended in a third direction different from the first direction,
a fourth bonding segment, and
a second connection segment configured to provide an electrical connection between the third bonding segment and the fourth bonding segment,
wherein the second ILB electrode is configured to be bonded to the integrated circuit chip using one of the third bonding segment or the fourth bonding segment.

4. The display panel of claim 3, wherein the fourth bonding segment is extended in the third direction.

5. The display panel of claim 3, wherein the first ILB electrode is positioned further than the second ILB electrode from a vertical reference line defined to extend in the vertical direction of the display panel,
wherein the vertical reference line is aligned with a center line of the integrated circuit chip when the integrated circuit chip is bonded to the display panel, and
wherein a first acute angle formed between the vertical reference line and the first direction in which the first bonding segment is extended is larger than a second acute angle formed between the vertical reference line and the third direction in which the third bonding segment is extended.

6. The display panel of claim 1, further comprising an alignment mark adapted to the integrated circuit chip.

7. The display panel of claim 6, wherein the second bonding segment is positioned in the vertical direction of the display panel with respect to the first bonding segment and further than the first bonding segment from the alignment mark.

8. The display panel of claim 6, further comprising a bonding electrode on the plastic substrate, the bonding electrode being positioned closer to the alignment mark than the first ILB electrode and configured to be bonded to the integrated circuit chip.

9. A method, comprising:
preparing a display panel comprising:
a plastic substrate; and a first ILB electrode on the plastic substrate, the first ILB electrode comprising:
   a first bonding segment extended in a first direction oblique to a vertical direction of the display panel;
   a second bonding segment, wherein the second bonding segment is extended in the first direction; and
   a first connection segment configured to provide an electrical connection between the first bonding segment and the second bonding segment,
bonding a first bump of an integrated circuit chip to one of the first bonding segment or the second bonding segment.

10. The method of claim 9, wherein the first connection segment is extended in a second direction different from the first direction.

11. The method of claim 9, wherein the display panel further comprises an alignment mark,
   wherein the second bonding segment is positioned further than the first bonding segment from the alignment mark.

12. The method of claim 11, wherein the integrated circuit chip comprises a frame memory configured to store image data for an entire frame image.

13. The method of claim 11, wherein the integrated circuit chip does not comprise any memory capable of storing image data for an entire frame image.

14. The method of claim 11, wherein the integrated circuit chip is designed according to one of a first design rule or a second design rule different from the first design rule.

15. The method of claim 14, the first design rule offers a higher integration density than the second design rule.

16. The method of claim 9, wherein the display panel further comprises a second ILB electrode formed on the plastic substrate,
   wherein the second ILB electrode comprises:
      a third bonding segment extended in a third direction different from the first direction;
      a fourth bonding segment; and
      a second connection segment configured to provide an electrical connection between the third bonding segment and the fourth bonding segment,
   wherein the method further comprising:
      bonding a second bump of the integrated circuit chip to the fourth bonding segment.

17. The method of claim 16, wherein the first ILB electrode is positioned further than the second ILB electrode from a vertical reference line defined to extend in the vertical direction of the display panel,
   wherein the vertical reference line is aligned with a center line of the integrated circuit chip when the integrated circuit chip is bonded to the display panel, and
   wherein a first acute angle formed between the vertical reference line and the first direction in which the first bonding segment is extended is larger than a second acute angle formed between the vertical reference line and the third direction in which the third bonding segment is extended.

18. A display module, comprising:
   a display panel; and
   a product integrated circuit chip bonded on the display panel,
   wherein the display panel comprises:
      a plastic substrate; and
      a first ILB electrode on the plastic substrate,
   wherein the first ILB electrode comprises:
      a first bonding segment extended in a first direction oblique to a vertical direction of the display panel;
      a second bonding segment, wherein the second bonding segment is extended in the first direction; and
      a first connection segment configured to provide an electrical connection between the first bonding segment and the second bonding segment,
   wherein a bump of the product integrated circuit chip is bonded to a selected one of the first bonding segment and the second bonding segment.

* * * * *